(12) United States Patent
Zhang et al.

(10) Patent No.: US 11,600,619 B2
(45) Date of Patent: Mar. 7, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Panpan Liu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 148 days.

(21) Appl. No.: 17/034,129

(22) Filed: Sep. 28, 2020

(65) Prior Publication Data

US 2021/0125987 A1  Apr. 29, 2021

(30) Foreign Application Priority Data

Oct. 23, 2019 (CN) .......................... 201911012609.X (51) Int. Cl.
| | | |
|---|---|---|
| *H01L 27/092* | (2006.01) | |
| *H01L 21/8234* | (2006.01) | |
| *H01L 29/78* | (2006.01) | |
| *H01L 21/3213* | (2006.01) | |
| *H01L 29/66* | (2006.01) | |
| *H01L 21/321* | (2006.01) | |

(52) U.S. Cl.
CPC ...... *H01L 27/0924* (2013.01); *H01L 21/3212* (2013.01); *H01L 21/32136* (2013.01); *H01L 21/823431* (2013.01); *H01L 21/823475* (2013.01); *H01L 21/823481* (2013.01); *H01L 29/66795* (2013.01); *H01L 29/785* (2013.01)

(58) Field of Classification Search
CPC .......... H01L 27/0924; H01L 21/76847; H01L 21/76879; H01L 21/823431; H01L 21/76834; H01L 29/66795; H01L 29/785; H01L 23/5286
See application file for complete search history.

(56) References Cited

U.S. PATENT DOCUMENTS

| | | | | |
|---|---|---|---|---|
| 6,258,707 B1 * | 7/2001 | Uzoh | ................ | H01L 21/76877 257/E21.585 |
| 2018/0374791 A1 * | 12/2018 | Smith | ................ | H01L 29/78696 |
| 2021/0035860 A1 * | 2/2021 | Dentoni Litta | ... | H01L 21/76879 |

* cited by examiner

*Primary Examiner* — Tuan A Hoang
(74) *Attorney, Agent, or Firm* — Anova Law Group, PLLC (57) ABSTRACT

A semiconductor structure and its fabrication method are provided in the present disclosure. The method includes providing a substrate, forming a plurality of fins on the substrate, and forming an isolation structure layer including a plurality of isolation structures on the substrate, each isolation structure being formed between adjacent fins. The method further includes forming a first opening by etching at least one isolation structure of the plurality of isolation structures and a portion of the substrate, and forming a power rail by filling the first opening with a conductive material, where a top surface of the power rail is lower than a top surface of the plurality of fins.

13 Claims, 6 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 201911012609.X, filed on Oct. 23, 2019, the content of which is incorporated herein by reference in its entirety.

TECHNICAL FIELD

The present disclosure generally relates to the field of semiconductor manufacturing and, more particularly, relates to a semiconductor structure and its fabrication method.

BACKGROUND

In integrated circuit (IC) manufacturing, standard cells, used as basic elements for fabricating IC devices, are arranged and wired to form functional circuits. Each standard cell needs a power (Vdd) input and a ground (Vss) connection when in use. In order to supply power to a variety of components, each standard cell is coupled to a power rail, which is electrically connected to an active layer of the standard cell, to supply the power (Vdd). In certain cases, a plurality of power rails may be provided to each standard cell to respectively provide the power (Vdd) input and the ground (Vss) connection.

The standard cell may be designed to be a stacked structure having various metal layers, and each metal layer may include wiring traces. Various interconnection elements may be formed in the wiring traces to allow connections between various components of the standard cell and to allow connections of various components of the standard cell with other standard cells.

In the existing technology, the power rail may be arranged in one metal layer of various metal layers and then be connected to the active layer of the standard cell through a conduction pass, which may occupy much space in the metal layer for forming wiring traces and various interconnection elements. As such, in order to improve the response speed of the integrated circuit, the dimension of the standard cell needs to be enlarged to provide a larger wiring trace space, which may not be beneficial for the advancement to the next process node of the semiconductor technology.

SUMMARY

One aspect of the present disclosure provides a method for fabricating a semiconductor structure. The method includes providing a substrate; forming a plurality of fins on the substrate; forming an isolation structure layer including a plurality of isolation structures on the substrate, each isolation structure being formed between adjacent fins; forming a first opening by etching at least one isolation structure of the plurality of isolation structures and a portion of the substrate; and forming a power rail by filling the first opening with a conductive material, where a top surface of the power rail is lower than a top surface of the plurality of fins.

Optionally, the conductive material is made of a material including ruthenium, copper, graphene, or a combination thereof.

Optionally, the first opening is filled with the conductive material by an electrochemical deposition process.

Optionally, forming the first opening by etching the at least one isolation structure and the portion of the substrate includes etching the at least one isolation structure till a surface of the portion of the substrate is exposed to form a first trench; and continuously etching the portion of the substrate along the first trench to form the first opening.

Optionally, etching the at least one isolation structure includes forming a patterned photoresist layer on the isolation structure layer; using the patterned photoresist layer as a mask, etching the at least one isolation structure to form a second trench; removing the patterned photoresist layer; forming a first mask layer on the isolation structure layer, and on sidewalls and a bottom of the second trench; etching the first mask layer to form a second opening and exposing the bottom of the second trench by the second opening; and etching the isolation structure layer along the second opening till the surface of the substrate is exposed to form the first trench.

Optionally, etching the first mask layer includes forming a second mask layer on the first mask layer, where the second mask layer exposes the first mask layer at the bottom of the second trench; and using the second mask layer as a mask, removing the first mask layer at the bottom of the second trench to form the second opening.

Optionally, the first mask layer is made of a material including silicon nitride, aluminum nitride, silicon carbide, or a combination thereof.

Optionally, the second mask layer is made of a hydrocarbon polymer.

Optionally, forming the power rail includes forming a conductive material layer by filling the first opening with the conductive material; performing a chemical mechanical polishing process on the conductive material layer, such that a top of the conductive material layer is coplanar with a surface of the first mask layer; and forming the power rail by removing a portion of the conductive material layer, such that the top surface of the power rail is lower than the top surface of the plurality of fins.

Optionally, the conductive material layer is etched by a dry etching process having process parameters including an etching gas, including carbon tetrafluoride, boron trichloride, oxygen, chlorine, helium, or a combination thereof; an etching pressure of about 2 mTorr to about 100 mTorr; and an etching temperature of about 0° C. to about 150° C.

Optionally, forming the first opening by etching the at least one isolation structure and the portion of the substrate includes a plasma dry etching process.

Optionally, after forming the power rail, a metal layer is formed on the power rail.

Optionally, a top surface of the isolation structure layer is coplanar with the top surface of the plurality of fins.

Another aspect of the present disclosure provides a semiconductor structure. The semiconductor structure includes a substrate; a plurality of fins, formed on the substrate; a plurality of isolation structures, each formed on a top surface of the substrate between adjacent fins; and a power rail, formed in at least one isolation structure of the plurality of isolation structures and further in the substrate, where a top surface of the power rail is lower than a top surface of the plurality of fins.

Optionally, the semiconductor structure further includes a metal layer, formed on the power rail.

Optionally, the metal layer is made of a material including cobalt, tungsten, copper, ruthenium or platinum, or a combination thereof.

Optionally, a bottom surface of the power rail is lower than the top surface of the substrate.

Optionally, the power rail is made of a material including ruthenium, copper, graphene, or a combination thereof.

Optionally, the power rail is formed through the at least one isolation structure having portions of the at least one isolation structure on sidewalls of the power rail; and a mask layer is formed on the portions of the at least one isolation structure and on the plurality of fins.

Optionally, the mask layer is made of a material including silicon nitride, aluminum nitride, silicon carbide, or a combination thereof.

Compared with the existing technology, the technical solutions provided by the present disclosure may achieve at least the following beneficial effects.

The power rail may be formed in the isolation structure and the substrate between any adjacent fins, and the top surface of the power rail may be lower than the top surface of the fins. The power rail and the active layer of the standard cell may be in a same layer, which may release the space occupied by the wiring traces in the metal layer. When a same response speed of the semiconductor structure is satisfied, the dimension of the standard cell may be reduced, which is beneficial for the advancement to the next process node of the semiconductor technology; or under a same dimension of the standard cell, more space may be available for the wiring traces, thereby improving the performance of the semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor structure and its fabrication method are provided in the present disclosure. The method includes providing a substrate, forming a plurality of fins on the substrate, and forming an isolation structure layer including a plurality of isolation structures on the substrate, each isolation structure being formed between adjacent fins. The method further includes forming a first opening by etching at least one isolation structure of the plurality of isolation structures and a portion of the substrate, and forming a power rail by filling the first opening with a conductive material, where a top surface of the power rail is lower than a top surface of the plurality of fins.

When a power rail is used to supply power to the standard cell in the integrated circuit, the power rail is arranged in one or more of the metal layers of the standard cell. A conduction path is then used to connect the metal layer and the power rail that is connected between metal layers or used to connect the power rail to the active layer of the standard cell. The metal layer includes wiring traces; and the more wiring traces are, the faster the response speed of the semiconductor structure is. The arrangement of the power rail in the metal layer may cause the reduction of the space available for wiring traces, resulting in a decrease in the semiconductor speed and affecting the device performance of the semiconductor structure. In order to improve the semiconductor device performance, the dimension of the standard cell is increased to provide more space for wiring traces, which however may not be beneficial for further advancement of the technology node of the semiconductor process.

Various embodiments of present disclosure provide semiconductor structures and formation methods thereof. For example, a first opening may be formed in an isolation structure layer, including a plurality of isolation structures, and a substrate between any adjacent fins. A power rail may be formed in the first opening. A portion of the power rail may be buried in the substrate, and the power rail may be at a same layer as the active layer of the semiconductor structure, without being connected through a conduction path. The space available for wiring traces in the metal layer of the standard cell may be released. Under a same response speed, the dimension of the standard cell may be reduced; or under a same dimension of the standard cell, more space may be available for the wiring traces, thereby improving the response speed of the semiconductor structure.

In order to clearly illustrate the above-mentioned described objectives, features, and advantages of the present disclosure, various embodiments of the present disclosure are described in detail with reference to the accompanying drawings hereinafter.

FIGS. 1-10 illustrate structural schematics corresponding to certain stages of a method for forming an exemplary semiconductor structure according to various disclosed embodiments of the present disclosure.

Figure 1:
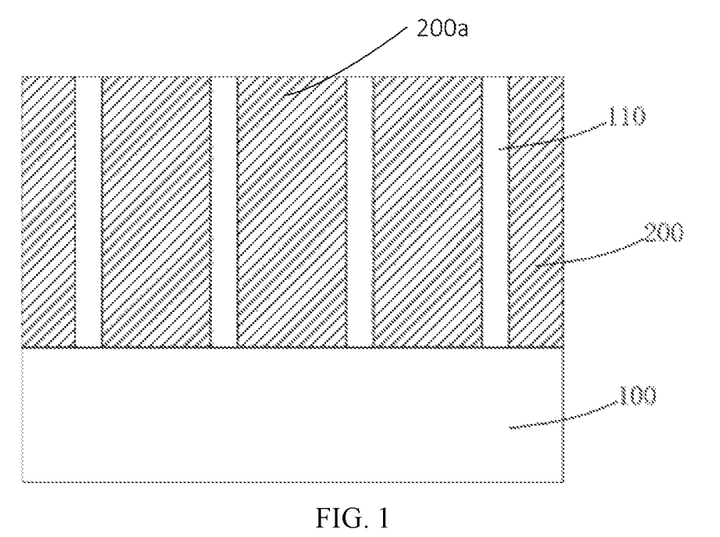
FIGS. 1-10 illustrate structural schematics corresponding to certain stages of a method for forming an exemplary semiconductor structure according to various disclosed embodiments of the present disclosure.
Figure 11:
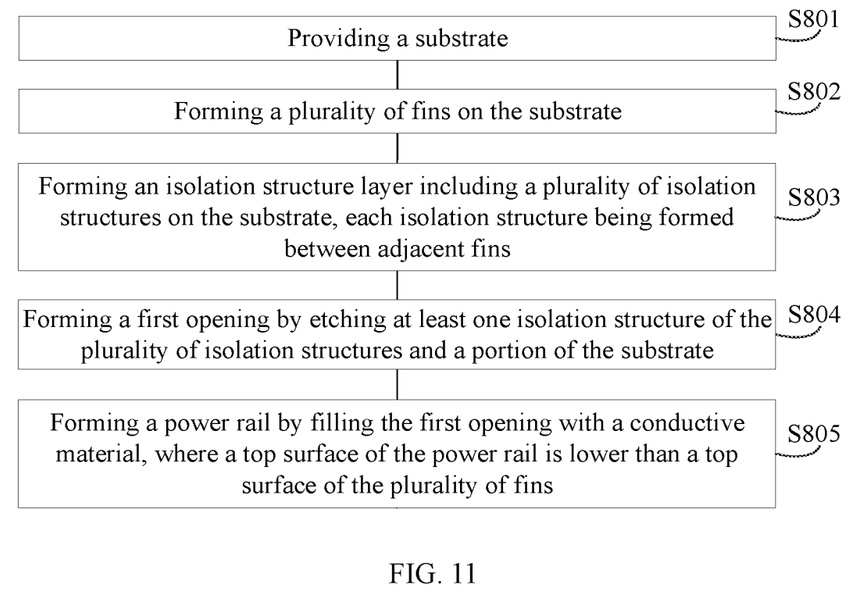
FIG. 11 illustrates a flowchart of an exemplary fabrication method for forming a semiconductor structure according to various disclosed embodiments of the present disclosure.

Referring to FIG. 1, a substrate 100 may be provided (e.g., in S801 of FIG. 11), and fins 110 may be formed on the substrate (e.g., in S802 of FIG. 11).

In one embodiment, the substrate 100 may be a silicon substrate. In other embodiments, the substrate 100 may be any one of a germanium substrate, a silicon germanium substrate, a silicon carbide substrate, a silicon-on-insulator, a germanium-on-insulator substrate, and/or any other suitable substrate(s).

In one embodiment, the fins 110 may be made of silicon. In other embodiments, the fins 110 may be made of a material including germanium, silicon germanium, and/or any other suitable substrate(s).

In one embodiment, forming the fins 110 on the substrate 100 may include forming a patterned mask layer (not shown), corresponding to the positions of the fins 110 needed to be formed, on the substrate 100; and etching a portion of the substrate 100 using the patterned mask layer as a mask to form a plurality of discrete fins 110 on the substrate 100.

It should be noted that the spacings between adjacent fins 110 shown in FIG. 1 may be equal to each other. However, in actual semiconductor devices, the spacings between the fins may not be necessarily equal to each other.

In one embodiment, after forming the fins 110, the pattern mask layer may be directly removed. In other embodiments, the patterned mask layer may be removed after a power rail is subsequently formed.

It should be noted that the standard cells may be any types of cells and have different device architectures. In one embodiment, the standard cell may be a fin FET, which may not be limited according to various embodiments of the present disclosure.

Referring to FIG. 1, an isolation structure layer 200, including a plurality of isolation structures 200a, may be formed on the substrate 100 between adjacent fins 110; and each isolation structure 200a may be formed between any adjacent fins (e.g., in S803 of FIG. 11). The top surface of the isolation structure layer 200 may be coplanar with the top surface of the fins 110.

In one embodiment, the isolation structure layer 200 may be made of silicon oxide. In another embodiment, the isolation structure layer 200 may be made of silicon oxynitride.

In one embodiment, forming the isolation structure layer 200 may include depositing an isolation material layer on the substrate 100 between adjacent fins 110, where the isolation material layer may cover the surface of the substrate 100, and the sidewalls and top surfaces of the fins 110; and performing a chemical mechanical planarization process on the isolation material layer to make the top surface of the isolation material layer coplanar with the top surface of the fins 110 to form the isolation structure layer 200.

After the isolation structure layer 200 is formed, the isolation structure 200a and the substrate 100 between any adjacent fins 110 may be etched to form a first opening.

It should be noted that, in one embodiment, etching the isolation structure 200a and the substrate 100 may be a stepwise etching process. The isolation structure 200a may be first etched till exposing the surface of the substrate 100, and then a portion of the substrate 100 may be etched.

For example, etching the isolation structure 200a between any adjacent fins 110 may be described hereinafter.

Figure 2:
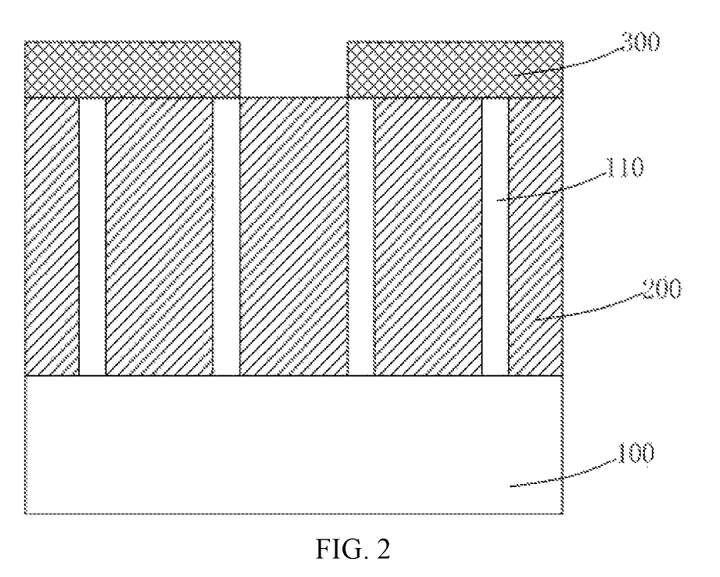

Referring to FIG. 2, a patterned photoresist layer 300 may be formed on the surface of the isolation structure layer 200.

In one embodiment, forming the patterned photoresist layer 300 may include depositing the photoresist on the surface of the isolation structure layer 200, and developing and exposing the photoresist to form the patterned photoresist layer. The patterned photoresist layer 300 may expose at least one isolation structure 200a between adjacent fins 110.

The exposed position of the patterned photoresist layer 300 may be the position for forming the power rail subsequently.

Figure 3:
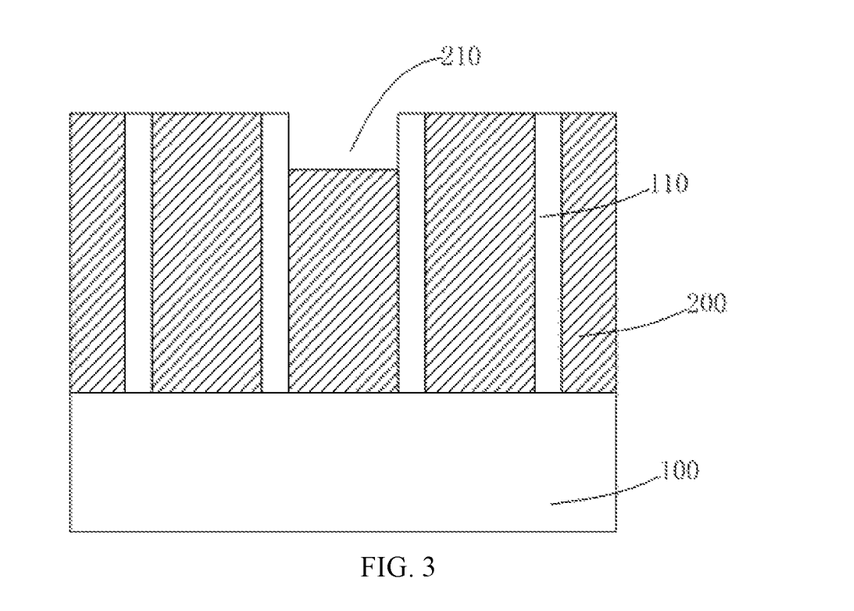

Referring to FIG. 3, using the patterned photoresist layer 300 as a mask, a portion of the isolation structure 200a between any adjacent fins 110 may be etched to form a second trench 210.

In one embodiment, the thickness of the etched isolation structure 200a may be about 1 nm to about 10 nm.

In one embodiment, the second trench 210 may provide positioning to the subsequent formation of a first mask layer for etching the isolation structure 200a.

After the second trench 210 is formed, the patterned photoresist layer 300 may be removed by a wet etching process or an ashing process.

Figure 4:
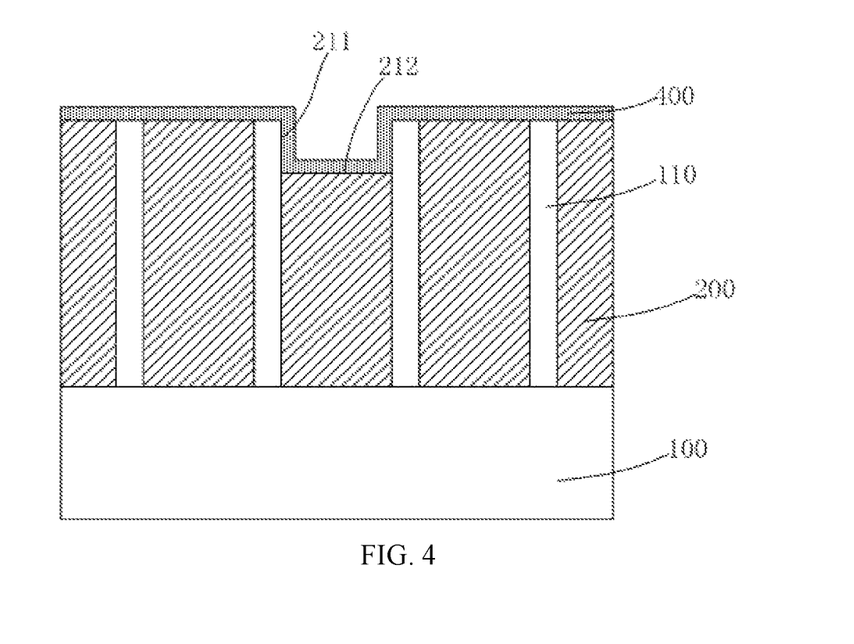

Referring to FIG. 4, a first mask layer 400 may be formed on the surface of the isolation structure layer 200, and on the sidewalls 211 and the bottom 212 of the second trench 210.

In one embodiment, the first mask layer 400 may be formed by an atomic layer vapor deposition method. In other embodiments, the first mask layer 400 may be formed by a chemical vapor deposition method, a physical vapor deposition method, or a combination thereof.

In one embodiment, the first mask layer 400 may be made of silicon nitride. In other embodiments, the first mask layer 400 may be made of a material including aluminum nitride, silicon carbide, and/or other suitable material(s).

After the first mask layer 400 is formed, the first mask layer 400 may be etched to form a second opening.

For example, etching the first mask layer 400 may be described hereinafter.

Figure 5:
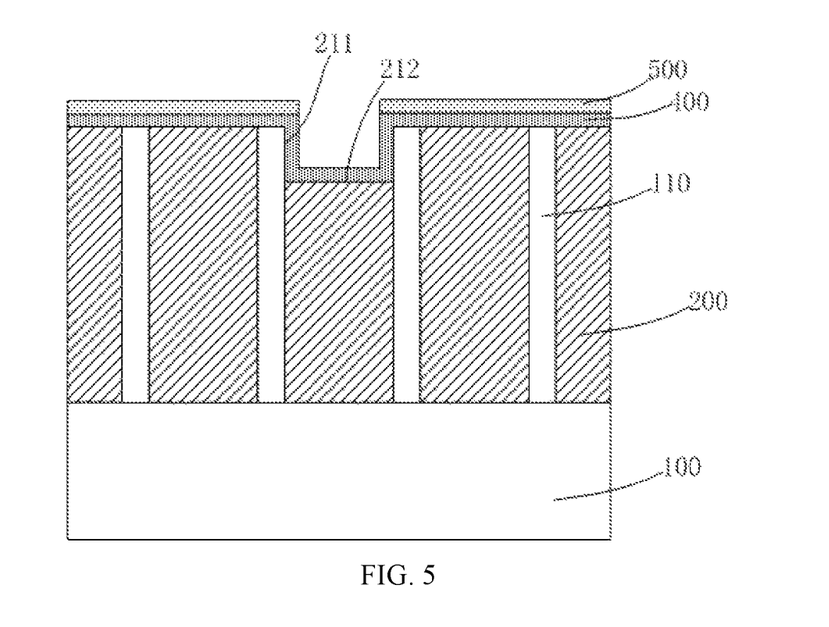

Referring to FIG. 5, a second mask layer 500 may be formed on the first mask layer 400. The second mask layer 500 may expose the first mask layer 400 at the bottom 212 of the second trench 210.

In one embodiment, the second mask layer 500 may be formed by an atomic layer vapor deposition. In other embodiments, the second mask layer 500 may be formed by a chemical vapor deposition, a physical vapor deposition, or a combination thereof.

In one embodiment, the second mask layer 500 may be made of a hydrocarbon polymer.

Figure 6:
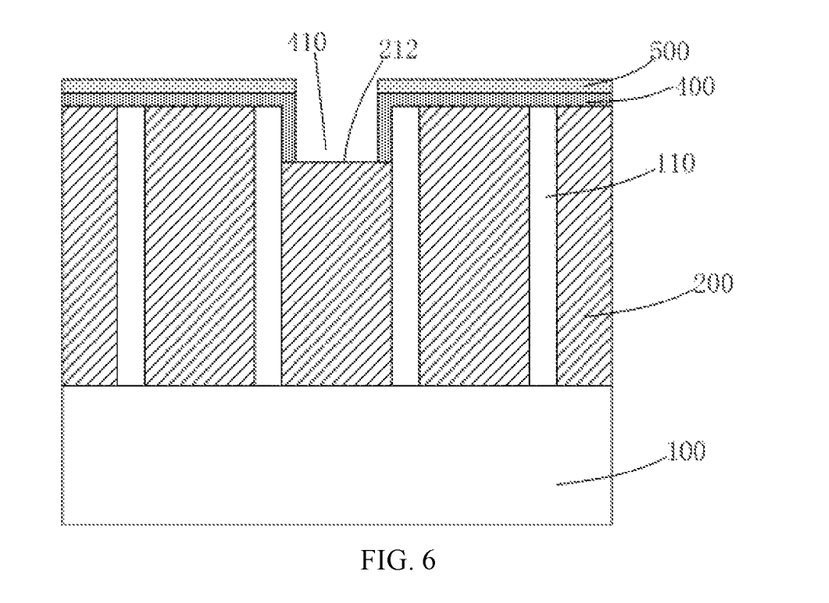

Referring to FIG. 6, using the second mask layer 500 as a mask, the first mask layer 400 at the bottom 212 of the second trench 210 may be etched to form a second opening 410.

In one embodiment, the first mask layer 400 may be etched by a dry etching process.

After removing the first mask layer 400 at the bottom 212 of the second trench 210, the second mask layer 500 may be removed by a wet etching process or an ashing process.

Figure 7:
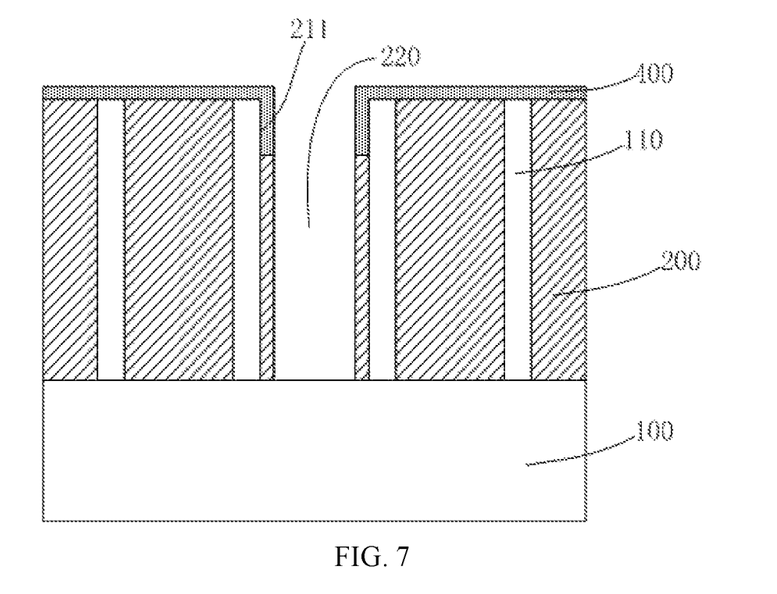

Referring to FIG. 7, the isolation structure 200a may be etched along the second opening 410 till exposing the surface of the substrate 100 to form a first trench 220 (e.g., in S804 of FIG. 11).

In one embodiment, the isolation structure 200a may be etched by a plasma dry etching process. The process parameters of the plasma dry etching process may include the etching gas including trifluoromethane ($CHF_3$), tetrafluoromethane Carbon ($CF_4$), fluoromethane ($CH_3F$), oxygen, or a combination thereof, the etching pressure of about 5 mTorr to about 100 mTorr, and the etching temperature of about 10° C. to about 120° C.

Figure 8:
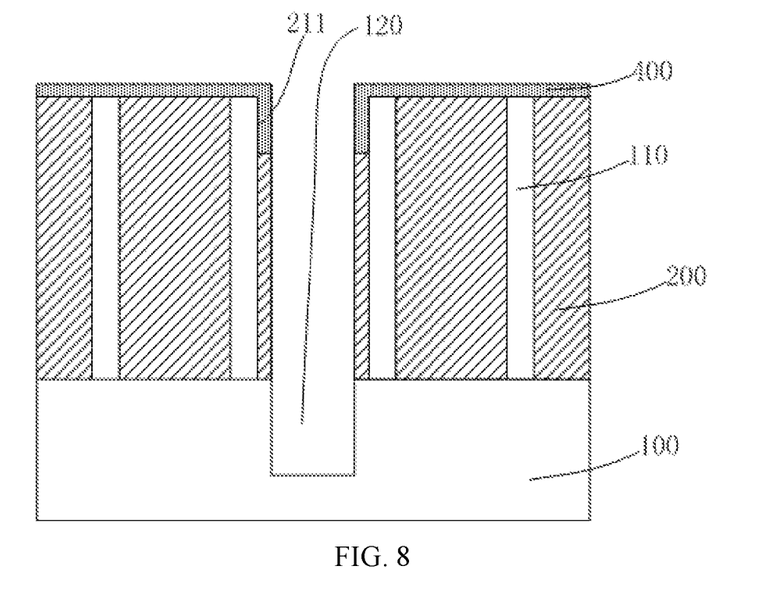

Referring to FIG. 8, a portion of the substrate 100 may be etched along the first trench 220 to form a first opening 120 (e.g., in S804 of FIG. 11).

In one embodiment, the etched thickness of the substrate 100 may be about 300 Å to about 1000 Å. The thickness to be etched of the substrate 100 may be selected according to actual process requirements.

In one embodiment, the substrate 100 may be etched by a plasma dry etching process. The process parameters of the plasma dry etching process may include the etching gas including hydrogen bromide (HBr), trifluoride Nitrogen ($NF_3$), chlorine, oxygen, or a combination thereof, the etching pressure of about 5 mTorr to about 100 mTorr, and the etching temperature about 10° C. to about 120° C.

In one embodiment, since the portion of the first mask layer 400 on the sidewalls 211 of the second trench 210 is remained, when the isolation structure 200a is subsequently etched using the first mask layer 400 as a mask, a portion of the isolation structure 200a may be remained on two sides of the first trench 220. On the one hand, the damage to the fins 110 may be avoided when the isolation structure 200a is etched. On the other hand, the width of the first trench 220 may also be controlled by controlling the thickness of the first mask layer 400 deposited on the sidewalls 211 of the second trench 210. The width of the first trench 220 corresponds to the dimension of the formed power rail, such that the dimension of the formed power rail may be controlled.

After the first opening 120 is formed, a conductive material may be filled in the first opening 120 to form a power rail.

For example, forming the power rail may be described hereinafter.

Figure 9:
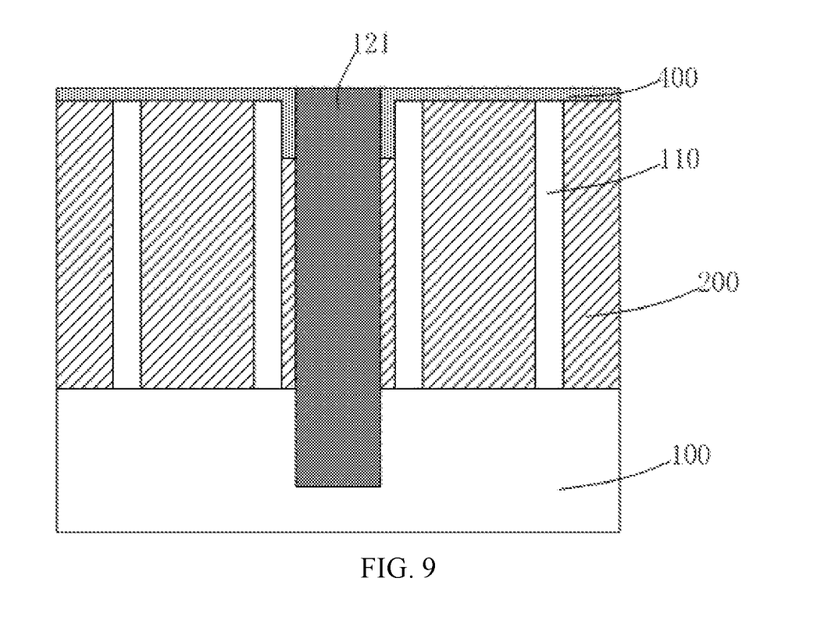

Referring to FIG. 9, the first opening 120 may be filled with the conductive material to form a conductive material layer 121 (e.g., in S805 of FIG. 11); and performing a chemical mechanical polishing process on the conductive material layer, such that the top surface of the conductive material layer 121 may be coplanar with the surface of the first mask layer 400.

In one embodiment, the first mask layer 400 may serve as a polishing stop layer of the conductive material layer 121 and may also protect the fins 110 from being damaged.

In one embodiment, the conductive material may be ruthenium (Ru). In other embodiments, the conductive material may be copper (Cu), graphene, and/or any other suitable material(s).

In one embodiment, ruthenium may be used as the material for forming the power rail. Ruthenium has desirable electrical conductivity, high temperature and corrosion resistance, and excellent electrical performance. It may be an excellent choice for replacing original conductive materials such as copper in the next semiconductor technological process.

In one embodiment, filling the conductive material may be performed by an electrochemical deposition process.

Figure 10:
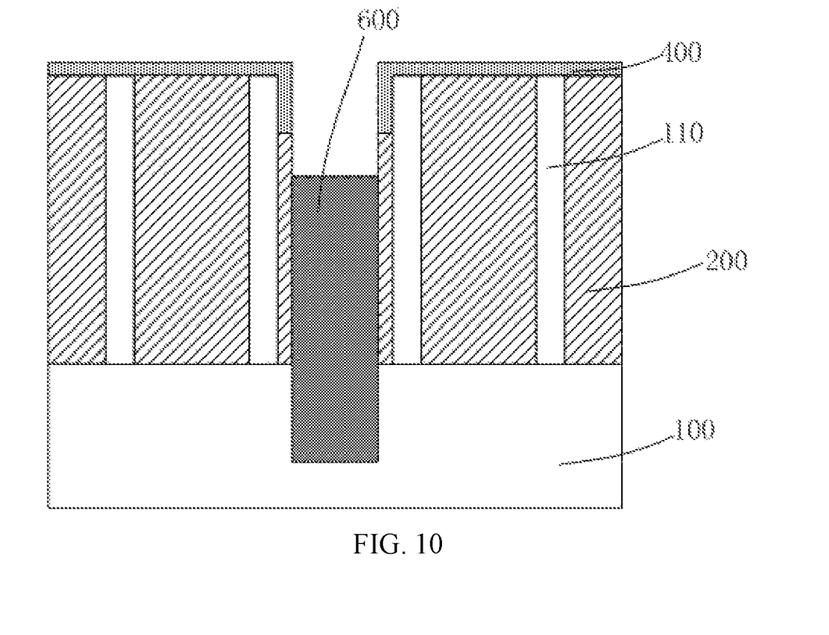

Referring to FIG. 10, a portion of the conductive material layer 121 may be etched to form a power rail 600, where the top surface of the power rail 600 may be lower than the top surface of the fin 110 (e.g., in S805 of FIG. 11).

In one embodiment, the conductive material layer 121 may be etched by a dry etching process. The etching process parameters may include the etching gas including carbon tetrafluoride ($CF_4$), boron trichloride ($BCl_3$), oxygen, chlorine, helium, or a combination thereof, where the flow rate of carbon tetrafluoride is about 0 sccm to 100 sccm, the flow rate of boron trichloride is about 30 sccm to 500 sccm, the flow rate of oxygen is about 0 sccm to about 100 sccm, the flow rate of chlorine is about 0 sccm to about 100 sccm, and the flow rate of helium is about 50 sccm to about 500 sccm, and may also include the etching pressure of about 2 mTorr to about 100 mTorr, and the etching temperature of about 0° C. to about 150° C.

After the power rail 600 is formed, the first mask layer 400 may be removed by a wet etching process or an ashing process.

In one embodiment, after the power rail 600 is formed, a metal layer (not shown) may be formed on the power rail 600.

The metal layer may be made of a metal material including cobalt, tungsten, copper, ruthenium or platinum, and/or any other suitable material(s).

According to the method for forming the semiconductor structure provided by the embodiments of the present disclosure, the power rail may be formed in the isolation structure and the substrate between any adjacent fins, and the top surface of the power rail may be lower than the top surface of the fin. The power rail and the active layer of the standard cell may be located in a same layer, which may release the space occupied by wiring traces in the metal layer. When a same response speed is satisfied, the dimension of the standard cell may be reduced, which is beneficial for the advancement of the semiconductor technology to a next process node.

Referring to FIG. 10, correspondingly, the embodiments of the present disclosure also provide a semiconductor structure formed by the above-mentioned fabrication methods. The semiconductor structure may include the substrate 100, fins 110 formed on the substrate 100; the plurality of isolation structures 200a on the substrate 100 between adjacent fins 110; the power rail 600 in at least one isolation structure 200a and in the substrate 100 between any adjacent fins 110, where the top surface of the power rail 600 may be lower than the top surface of the fins 110.

In one embodiment, a portion of the isolation structure 200 may still be remained between the power rail 600 and the fins 110.

In one embodiment, the power rail 600 may be made of ruthenium. In other embodiments, the power rail 600 may be made of copper, graphene, and/or any other suitable material(s).

In one embodiment, the semiconductor structure may further include the metal layer (not shown), and the metal layer may be on the power rail 600.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A method for fabricating a semiconductor structure, comprising:
    providing a substrate;
    forming a plurality of fins on the substrate;
    forming an isolation structure layer including a plurality of isolation structures on the substrate, each isolation structure being formed between adjacent fins;
    forming a first opening by etching at least one isolation structure of the plurality of isolation structures and a portion of the substrate, wherein a remaining portion of the at least one isolation structure of the plurality of isolation structures has a top surface lower than a top surface of the isolation structure layer; and
    forming a power rail by filling the first opening with a conductive material, wherein a top surface of the power rail is lower than a top surface of the plurality of fins, lower than the top surface of the remaining portion of the at least one isolation structure of the plurality of isolation structures, and higher than a top surface of the substrate.

2. The method according to claim 1, wherein:
    the conductive material is made of a material including ruthenium, copper, graphene, or a combination thereof.

3. The method according to claim 1, wherein:
    the first opening is filled with the conductive material by an electrochemical deposition process.

4. The method according to claim 1, wherein forming the first opening by etching the at least one isolation structure and the portion of the substrate includes:
    etching the at least one isolation structure till a surface of the portion of the substrate is exposed to form a first trench; and
    continuously etching the portion of the substrate along the first trench to form the first opening.

5. The method according to claim 1, wherein:
    forming the first opening by etching the at least one isolation structure and the portion of the substrate includes a plasma dry etching process.

6. The method according to claim 1, wherein:
    after forming the power rail, a metal layer is formed on the power rail.

7. The method according to claim 1, wherein:
    a top surface of the isolation structure layer is coplanar with the top surface of the plurality of fins.

8. A method for fabricating a semiconductor structure, comprising:
provided a substrate;
forming a plurality of fins on the substrate;
forming an isolation structure layer including a plurality of isolation structures on the substrate, each isolation structure being formed between adjacent fins;
forming a first opening by etching at least one isolation structure of the plurality of isolation structures and a portion of the substrate; and
forming a power rail by filling the first opening with a conductive material, wherein a top surface of the power rail is lower than a top surface of the plurality of fins,
wherein forming the first opening by etching the at least one isolation structure and the portion of the substrate includes:
etching the at least one isolation structure till a surface of the portion of the substrate is exposed to form a first trench;
continuously etching the portion of the substrate along the first trench to form the first opening; and
etching the at least one isolation structure includes:
forming a patterned photoresist layer on the isolation structure layer;
using the patterned photoresist layer as a mask, etching the at least one isolation structure to form a second trench;
removing the patterned photoresist layer;
forming a first mask layer on the isolation structure layer, and on sidewalls and a bottom of the second trench;
etching the first mask layer to form a second opening and exposing the bottom of the second trench by the second opening; and
etching the at least one isolation structure along the second opening till the surface of the substrate is exposed to form the first trench.

9. The method according to claim 8, wherein etching the first mask layer includes:
forming a second mask layer on the first mask layer, wherein the second mask layer exposes the first mask layer at the bottom of the second trench; and
using the second mask layer as a mask, removing the first mask layer at the bottom of the second trench to form the second opening.

10. The method according to claim 8, wherein:
the first mask layer is made of a material including silicon nitride, aluminum nitride, silicon carbide, or a combination thereof.

11. The method according to claim 9, wherein:
the second mask layer is made of a hydrocarbon polymer.

12. The method according to claim 8, wherein forming the power rail includes:
forming a conductive material layer by filling the first opening with the conductive material;
performing a chemical mechanical polishing process on the conductive material layer, such that a top of the conductive material layer is coplanar with a surface of the first mask layer; and
forming the power rail by removing a portion of the conductive material layer, such that the top surface of the power rail is lower than the top surface of the plurality of fins.

13. The method according to claim 12, wherein:
the conductive material layer is etched by a dry etching process having process parameters including:
an etching gas, including carbon tetrafluoride, boron trichloride, oxygen, chlorine, helium, or a combination thereof;
an etching pressure of about 2 mTorr to about 100 mTorr; and
an etching temperature of about 0° C. to about 150° C.

* * * * *